(12) United States Patent
Dosunmu et al.

(10) Patent No.: US 9,900,102 B2
(45) Date of Patent: Feb. 20, 2018

(54) INTEGRATED CIRCUIT WITH CHIP-ON-CHIP AND CHIP-ON-SUBSTRATE CONFIGURATION

(71) Applicant: Intel Corporation, Santa Clara, CA (US)

(72) Inventors: Olufemi I. Dosunmu, San Jose, CA (US); Myung Jin Yim, San Jose, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/956,191

(22) Filed: Dec. 1, 2015

(65) Prior Publication Data

US 2017/0155450 A1 Jun. 1, 2017

(51) Int. Cl.
*H01L 27/15* (2006.01)
*H01L 29/267* (2006.01)
*H01L 31/12* (2006.01)
*H01L 33/00* (2010.01)
*H04B 10/40* (2013.01)
(Continued)

(52) U.S. Cl.
CPC .......... *H04B 10/40* (2013.01); *H01L 25/167* (2013.01); *H01L 25/50* (2013.01)

(58) Field of Classification Search
CPC . H01L 25/167; H01L 25/50; H01L 31/02005; H01L 31/02327; H01L 31/12; H01L 31/1804; H04B 10/40; G02B 6/42
USPC ............... 257/80–81, 84, 116, 114, 428, 43; 438/23–25, 48, 59; 385/14
See application file for complete search history.

(56) References Cited

U.S. PATENT DOCUMENTS 6,749,345 B1 * 6/2004 Gee .................. G02B 6/421
385/75
7,539,366 B1 * 5/2009 Baks ................. G02B 6/4201
385/14
(Continued)

OTHER PUBLICATIONS

International Search Report and Written Opinion dated Jan. 26, 2017 for International Application No. PCT/US2016/058068, 13 pages.

*Primary Examiner* — Lex Malsawma
*Assistant Examiner* — Nduka Ojeh
(74) *Attorney, Agent, or Firm* — Schwabe, Williamson & Wyatt, P.C.

(57) ABSTRACT

Embodiments of the present disclosure provide an apparatus comprising an integrated circuit with a chip-on-chip and chip-on-substrate configuration. In one instance, the apparatus may include an optical transceiver with an opto-electronic component disposed in a first portion of a die, and a trace coupled with the opto-electronic component and disposed to extend to a surface in a second portion of the die adjacent to the first portion, to provide electrical connection for the integrated circuit and another integrated circuit to be coupled with the second portion of the die in a chip-on-chip configuration. The apparatus may include a second trace disposed in the second portion of the die to extend to the surface in the second portion, to provide electrical connection for the other integrated circuit and a substrate to be coupled with the second portion of the die in a chip-on-substrate configuration. Other embodiments may be described and/or claimed.

17 Claims, 6 Drawing Sheets

(51) Int. Cl.
*H01L 25/16* (2006.01)
*H01L 25/00* (2006.01)

(56) References Cited

U.S. PATENT DOCUMENTS

| | | | | |
|---|---|---|---|---|
| 2005/0095747 | A1* | 5/2005 | Khorram | H01L 21/52 438/106 |
| 2006/0067606 | A1* | 3/2006 | Towle | G02B 6/42 385/14 |
| 2006/0221450 | A1* | 10/2006 | Wang | G01J 3/02 359/584 |
| 2007/0217750 | A1* | 9/2007 | Budd | G02B 6/42 385/89 |
| 2009/0226130 | A1* | 9/2009 | Doany | G02B 6/4201 385/14 |
| 2012/0163811 | A1* | 6/2012 | Doany | G02B 6/43 398/41 |
| 2012/0314492 | A1* | 12/2012 | Shin | G11C 13/00 365/163 |
| 2013/0273672 | A1* | 10/2013 | Heck | G01B 11/14 438/15 |
| 2014/0044388 | A1 | 2/2014 | Su et al. | |
| 2014/0097536 | A1* | 4/2014 | Schunk | H01L 31/02325 257/738 |
| 2014/0212085 | A1 | 7/2014 | Margaritis | |
| 2015/0062915 | A1* | 3/2015 | Hussell | F21V 7/22 362/296.01 |
| 2015/0153524 | A1* | 6/2015 | Chen | G02B 6/4228 385/14 |
| 2015/0295098 | A1 | 10/2015 | Toda | |
| 2016/0085038 | A1* | 3/2016 | Decker | G02B 6/4204 385/14 |

\* cited by examiner

INTEGRATED CIRCUIT WITH CHIP-ON-CHIP AND CHIP-ON-SUBSTRATE CONFIGURATION

FIELD

Embodiments of the present disclosure generally relate to the field of integrated circuits, and more particularly, to integrated circuits including optical devices and having a chip-on-chip and chip-on-substrate configuration.

BACKGROUND

Today's computing devices may be equipped with different types of components for high-speed and high-volume intra- and inter-device communications. Some computing devices may be equipped with various wireless input/output (I/O) components, such as integrated circuits (IC) that may include electrical and optical components, such as optical transceivers. Efficient integration of optical and electrical interfaces to enable ultra-compact, multichannel, high bit rate integrated circuit architecture may present some engineering challenges. For example, current design solutions for integrating ultra-compact, multichannel optical transceiver modules in integrated circuits may generally require complex optical coupling schemes that may be potentially inefficient.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include an apparatus comprising an integrated circuit with a chip-on-chip and chip-on-substrate configuration. In some embodiments, the apparatus may include an optical transceiver with an opto-electronic component disposed in a first portion of a die, and a trace coupled with the opto-electronic component and disposed to extend substantially to a surface in a second portion of the die adjacent to the first portion, to provide electrical connection for the integrated circuit and another integrated circuit to be coupled with the second portion of the die in a chip-on-chip configuration. The apparatus may further include a second trace disposed in the second portion of the die to extend substantially to the surface in the second portion, to provide electrical connection for the other integrated circuit and a substrate to be coupled with the second portion of the die in a chip-on-substrate configuration.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other.

Figure 1:
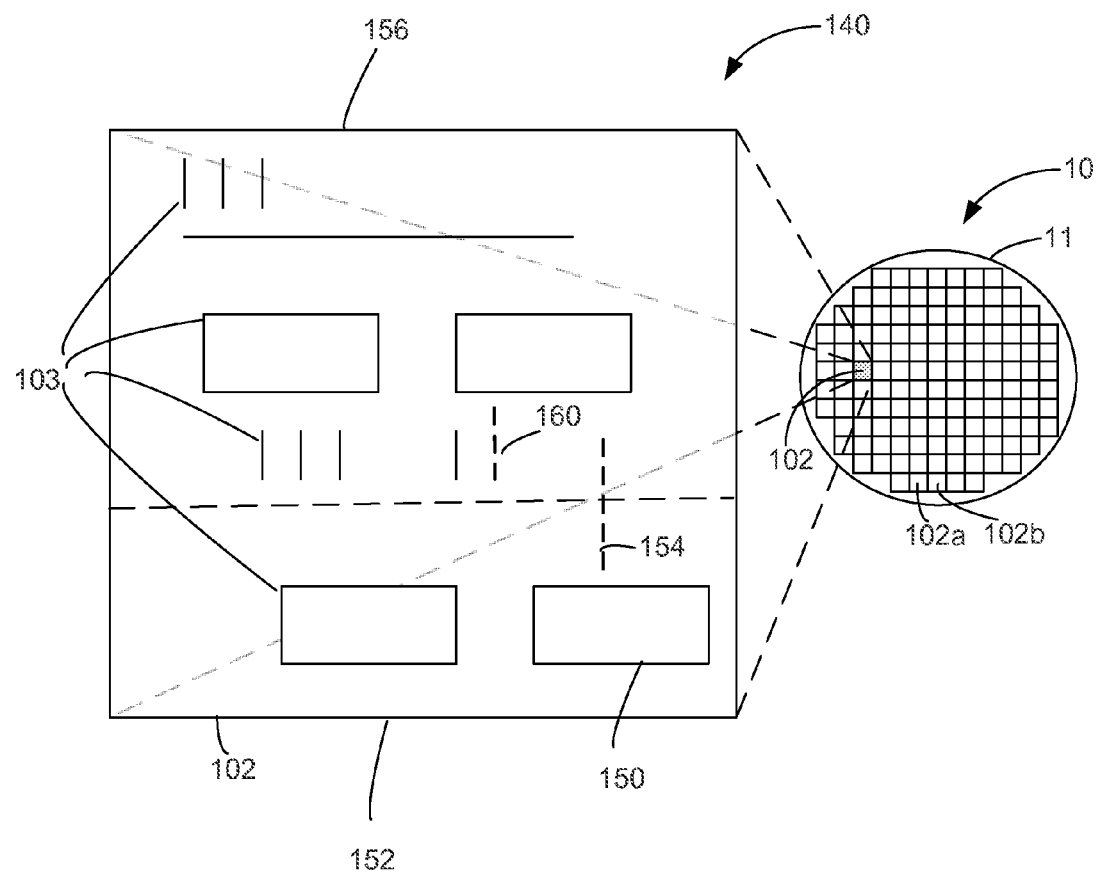
FIG. 1 is a block diagram illustrating an example die with an integrated circuit with a chip-on-chip and chip-on-substrate configuration of the present disclosure, in accordance with some embodiments.

FIG. 1 is a block diagram illustrating an example die with an integrated circuit with a chip-on-chip and chip-on-substrate configuration of the present disclosure, in accordance with some embodiments. More specifically, FIG. 1 schematically illustrates a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may include an integrated circuit device as described herein. The die 102 or integrated circuits formed thereon may include circuitry 103, e.g., circuitry of a processor and/or memory device, in accordance with some embodiments.

According to various embodiments, the circuitry 103 may also include an optical transceiver 150 disposed in a first portion 152 of the die 102, and at least a trace 154 coupled with the optical transceiver 150 and disposed to extend substantially to a surface of a second portion 156 of the die 102 that is adjacent to the first portion 152, to provide electrical connection for the integrated circuit comprising circuitry 103 and another integrated circuit (not shown) to be coupled with the second portion 156 of the die 102 in a chip-on-chip configuration. The circuitry 103 may further include a trace 160 disposed in the second portion 156 of the die 102 to extend substantially to the surface in the second portion 156, to provide electrical connection for the other integrated circuit (not shown) and a substrate (not shown) to be coupled with the second portion of the die in a chip-on-substrate configuration. These and other aspects of the configurations of the integrated circuits will be further described below.

In some embodiments, the integrated circuits, including circuitry 103, may be formed using suitable semiconductor fabrication techniques, some of which are described herein. After a fabrication process of the semiconductor product/integrated circuit is complete, the wafer 11 may undergo a singulation process in which each of the dies (e.g., die 102 having an integrated circuit formed thereon) may be separated from one another to provide discrete "chips" of the semiconductor product. The wafer 11 may be any of a variety of sizes. According to various embodiments, the integrated circuit, including circuitry 103, may be disposed on a semiconductor substrate in wafer form 10 or singulated form 140. In some embodiments, the die 102 may include logic, electrical, optical components, or combinations thereof.

Figure 2:
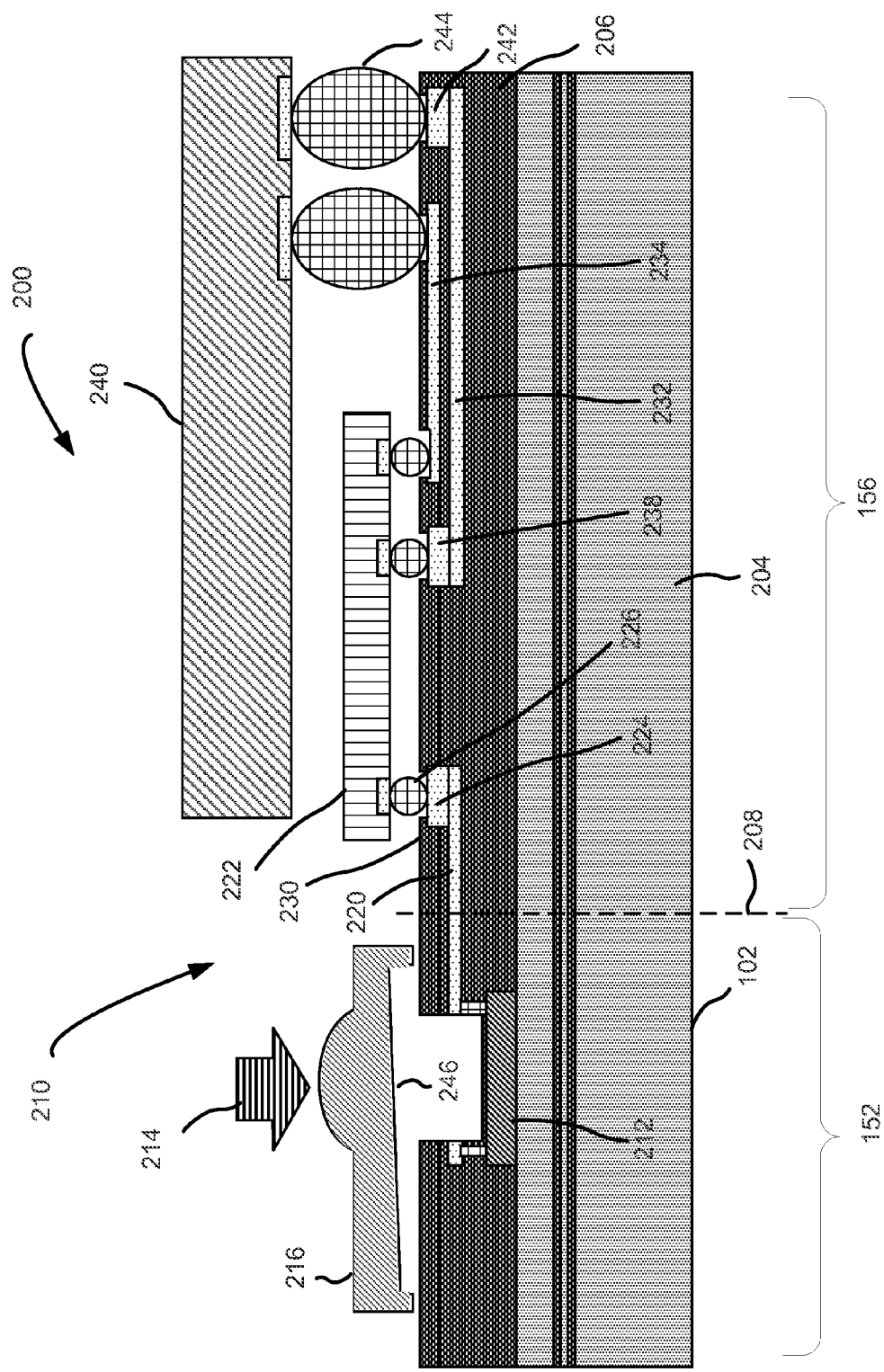
FIG. 2 schematically illustrates a cross-section side view of an example integrated circuit assembly with a chip-on-chip and chip-on-substrate configuration, in accordance with some embodiments.

FIG. 2 schematically illustrates a cross-section side view of an example integrated circuit (IC) assembly with a chip-on-chip and chip-on-substrate configuration, in accordance with some embodiments. In some embodiments, the IC assembly 200 may include one or more dies, e.g., die 102 of FIG. 1 comprising a semiconductor substrate (e.g., silicon or silicon-on-insulator substrate) 204 and a dielectric layer 206. In some embodiments, the die 102 may include, or be a part of, an IC including a memory, processor, System on Chip (SoC) or application-specific integrated circuit (ASIC). For example, the die 102 may include circuitry (e.g., circuitry 103 of FIG. 1) such as an IC 210 with chip-on-chip and chip-on-substrate configuration as described herein. As shown, the die 102 may include the first portion 152 and the second portion 156 adjacent to the first portion 152, as indicated by imaginary line 208 between the first and second portions of the die 102.

The IC 210 may include an optical transceiver with an opto-electronic component 212 disposed in the first portion 152 of the die 102, proximate to a surface of the die 102, e.g., inside the dielectric layer 206. While some components of an optical transceiver may be distributed throughout the assembly 200, the IC 210 may be called "an optical transceiver" hereinafter for ease of understanding. In some embodiments, the opto-electronic component 212 may comprise a normal-incidence photodetector (NIPD) configured to receive illumination (e.g., an optical signal 214) via an array of lenses 216 optically coupled with the opto-electronic component 212. Only one lens of the array 216 is shown in FIG. 2 for illustration purposes. It should be noted that the opto-electronic component 212 may comprise other forms of optical devices, such as, for example, an optical modulator. The opto-electronic component 212 comprising a photodetector is described herein as an example embodiment, and is not meant to limit the present disclosure.

The IC 210 may further include at least a trace 220 coupled with the opto-electronic component 212 and disposed in the die 102 to extend substantially to a surface 230 of the die 102 in the second portion 156 of the die 102, as shown. The trace 220 (which may include multiple traces in some embodiments) may be provided in the die 102 to enable electrical connection between the opto-electronic component 212 of the IC 210, and another integrated circuit, for example, IC 222, as shown. In embodiments, IC 222 may comprise a receiver configured to amplify the electrical output signal provided by the opto-electronic component 212 via the trace 220 in response to receiving the optical signal 214.

As shown, the IC 210 may be coupled with other IC 222 in the second portion 156 of the die 102 in a chip-on-chip configuration. To that end, the trace 220 may be coupled with a contact pad 224 disposed at the end of the trace 220 and extending to the surface 230 of the die 102, to provide electrical connectivity for the IC 210 and the other IC 222. The electrical connectivity between IC 210 and IC 222 may be further provided with other interconnect components, for example, a solder bump 226. While the trace 220 is shown for illustration purposes, it is noted that there may be multiple traces 220 disposed in the die 102 as described above, in order to provide electrical coupling between the opto-electronic component (e.g., NIPD) 212 and inputs of the signal amplification IC 222 (e.g., a receiver IC, hereinafter "receiver").

The IC 210 may further include a plurality of traces 232, 234 disposed proximate to the surface 230 in the second portion 156 of the die 102. As shown, the traces 232 (e.g., ground trace) and 234 (e.g., signal trace) may extend substantially to the surface in the second portion 156, to provide electrical connection for the IC 222 and a substrate 240. In some embodiments, the substrate 240 may be a multi-layer stack with alternating metal layer and dielectric layer, provided with build-up technology. In some embodiments, the substrate 240 may comprise or be part of a printed circuit board (PCB). The substrate 240 may be coupled with the second portion 156 of the die 102 in a chip-on-substrate configuration, using the electrical coupling provided by the traces 232, 234, and other interconnect components, such as pads 238, 242, and solder bumps 244, similar to the connections described above. As shown, the substrate 240 may be disposed substantially over the second portion 156 of the die 102.

In some embodiments, the plurality of traces 232, 234 may be disposed in the second portion 156 of the die 102 in a multi-layered fashion. For example, the signal and ground traces and pads may be connected to different metal layers in the dielectric layer 206, e.g., ground to Metal-1, and signal to Metal-2, where Metal-1 and Metal-2 may be different layers or levels of metallization, and not necessarily different in composition. These layers may enable routing of the receiver amplification IC ground and signal outputs to the PCB. Multi-layer traces at the receiver output may allow for desired signal integrity on the die 102.

Accordingly, the IC assembly 200 may be configured to receive the optical signal 214 at the opto-electronic component 212 of the IC 210. The opto-electronic component 212 may convert the optical signal into an electrical signal and provide the electrical signal to the IC 222 (receiver) via the trace 220 and interconnect components 224, 226 of the IC 210. The IC 222 may amplify the electrical output signal provided by the opto-electronic component 212 and may provide the amplified electrical output signal via the traces 232, 234, and corresponding interconnect components of the IC 210 to circuitry disposed in the substrate 240 (e.g., PCB). It is noted that the substrate 240 is shown as integrated with the IC 222 in a chip-on-substrate configuration. However, other types of connections are also possible, such as by wire-bonding, for example.

In some embodiments, the array of lenses 216 may be disposed above the first portion 152 of the die 102, as shown, to receive front side illumination by the light source (not shown) providing the optical signal 214. Each of the lenses may include a facet 246, angled as shown, to prevent formation of resonant cavities between the lenses and the NIPD. The semiconductor substrate may incorporate a highly reflective distributed Bragg reflector (DBR) multilayer stack, to provide a determined optical response for the NIPD, while maintaining a desired (e.g., high) bandwidth.

Figure 3:
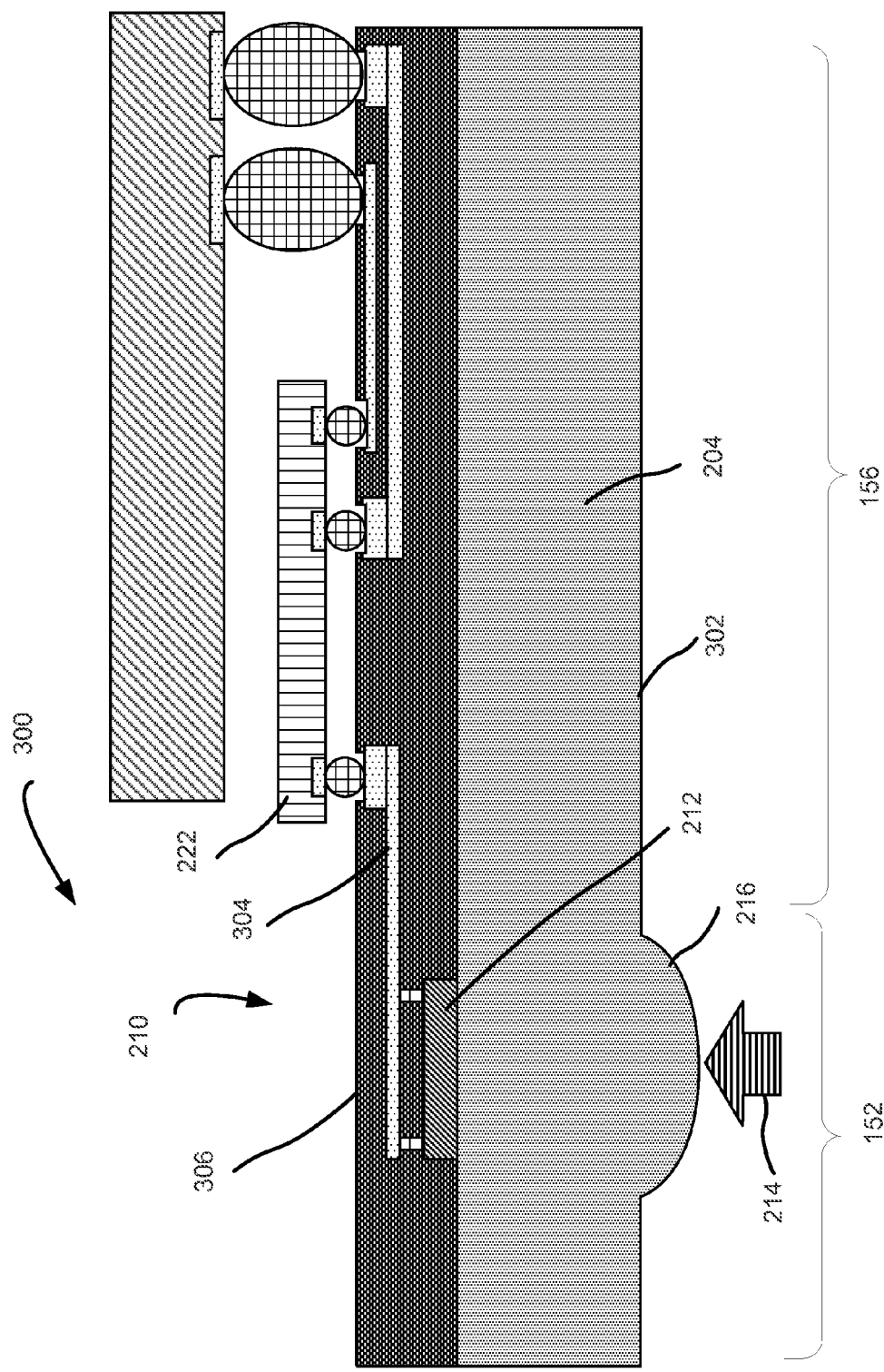
FIG. 3 schematically illustrates a cross-section side view of another example integrated circuit assembly with a chip-on-chip and chip-on-substrate configuration, in accordance with some embodiments.

FIG. 3 schematically illustrates a cross-section side view of another example integrated circuit assembly with a chip-on-chip and chip-on-substrate configuration, in accordance with some embodiments. As shown, the IC assembly 300 may be configured similar to the IC assembly 200 of FIG. 2. For ease of understanding, like elements are indicated with like numerals in FIGS. 2 and 3.

As shown, the array of lenses 216 may be integrated on a back surface 302 of the semiconductor substrate 204, in the first portion 152 of the die 102, to enable back side illumination. For back side illumination with optical signal 214, a signal contact trace 304 coupling the IC 222 to the optical receiver 212 (NIPD) may also be used as a reflector at the top side 306 of the IC 210.

Figure 4:
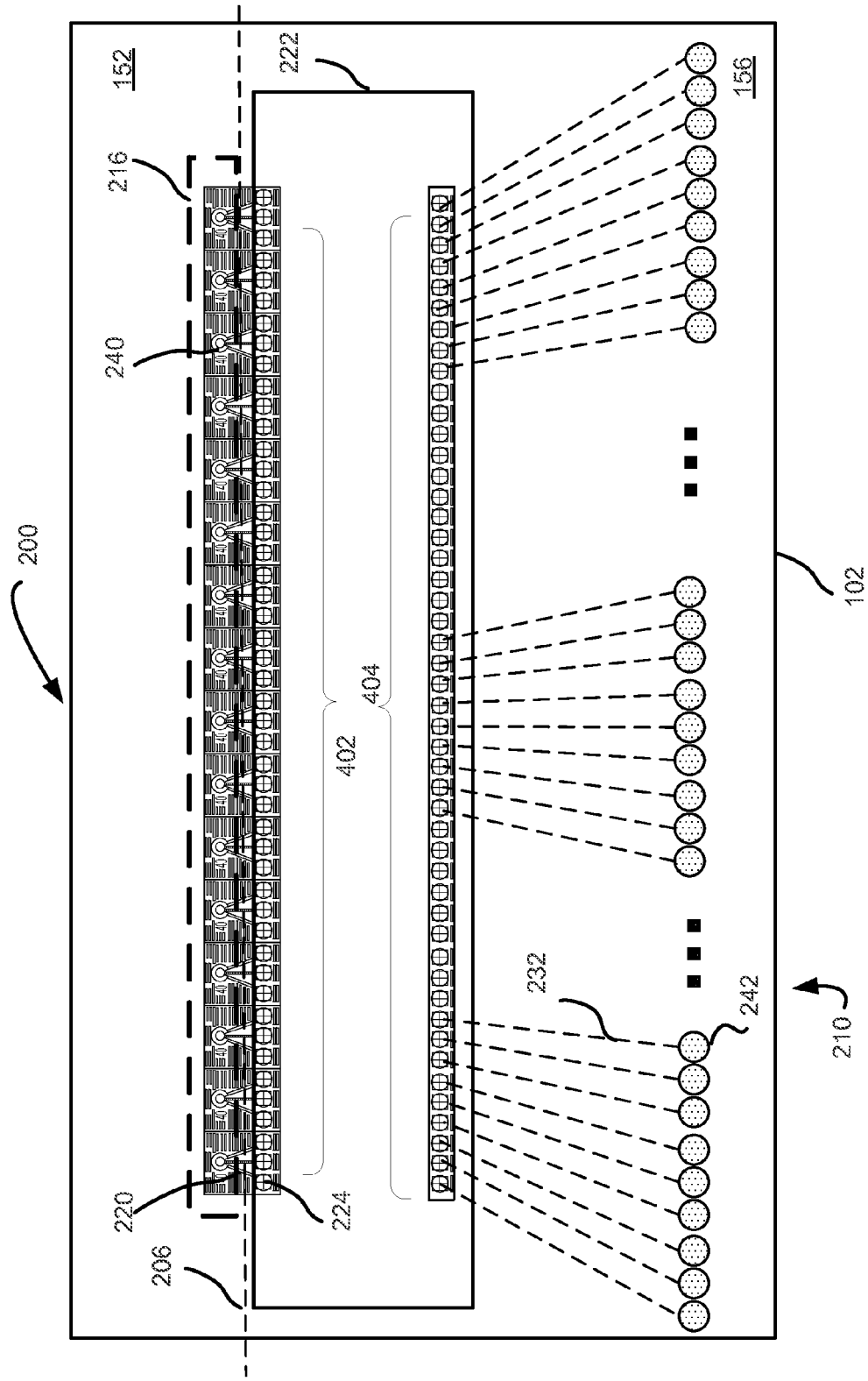
FIG. 4 schematically illustrates a top view of an example integrated circuit assembly provided in accordance with embodiments described in reference to FIG. 2.

FIG. 4 schematically illustrates a top view of an example integrated circuit assembly provided in accordance with embodiments described in reference to FIG. 2. For ease of understanding, like elements of the IC assembly 200 are indicated with like numerals in FIGS. 2 and 4. Also for ease of understanding, the substrate 240 is not shown in FIG. 4.

The imaginary line 208 indicates the division of the die 102 into first and second portions 152 and 156 such that the lens array 216 (outlined with a dashed line) is unobscured by the IC 222, allowing for top side illumination. The metal traces 220 may be provided from the optical transceiver (disposed underneath the array 216) to respective inputs of the IC 222 (e.g., a receiver) via pads 224. The metal pads 224 may form an array 402 of pads corresponding to the inputs of the IC 222, to enable chip-on-chip configuration between IC 222 and IC 210. Similarly, the metal pads 238 may form an array 404 of pads corresponding to the outputs of the IC 222, to further enable chip-on-chip configuration between IC 222 and IC 210. The multilayer traces 232 may connect the outputs of the IC 222 with pads 242, to enable a chip-on-substrate configuration for the IC 222 and a substrate (e.g., PCB, not shown).

As shown in FIGS. 2-4, the metal traces and pads may be configured to practically any pitch and size to accommodate a wide range of integrated circuit packaging requirements, with minimal impact to radio frequency signal integrity. In general, the embodiments described in reference to FIGS. 2-4 may provide for the integration of multilayer metal traces and pads onto the die 102, which may enable both chip-on-chip and chip-on-substrate flip-chip integration with low signal penalty for high-speed transmission line routing. The metal traces may be compatible with high bit rate electrical transmission through minimization of trace length. Further, the described embodiments may provide for the direct integration of optical coupling components such as lenses for optimized optical coupling into the photodetector array, without imposing length restrictions to the metal traces that may affect the overall receiver performance at high bit rates per channel, such as rates greater than 25 Gb/s per channel.

In summary, the described embodiments may provide for a compact, highly integrated, high channel count integration circuit including an optical transceiver, with a high bit rate (e.g., greater than 25 Gb/s per channel) architecture. Such an ultra-compact, high channel count and high bit rate optical transceiver module may be difficult to achieve with a conventional photodetector die through either wire-bonding or flip-chip integration. The described embodiments may further provide for elimination of complex (and potentially lossy) optical coupling schemes by allowing for normal incidence optical coupling (single-mode or multimode) directly into the photodetector, while keeping the electrical traces short enough to maintain RF signal integrity at very high bit rates per channel.

Figure 5:
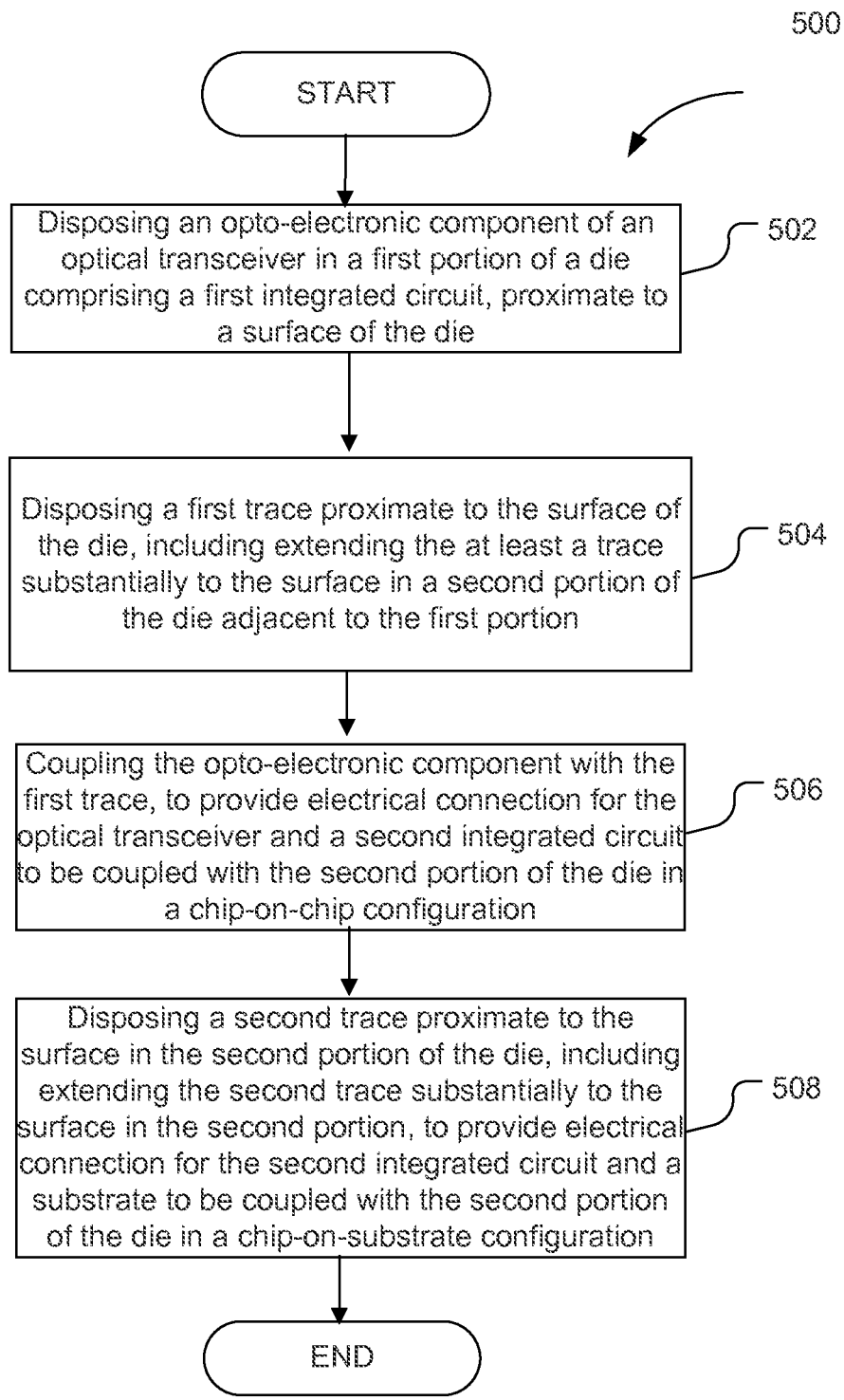
FIG. 5 is a process flow diagram for manufacturing an integrated circuit with chip-on-chip and chip-on-substrate configuration, in accordance with some embodiments.

FIG. 5 is a process flow diagram for manufacturing an integrated circuit with chip-on-chip and chip-on-substrate configuration, in accordance with some embodiments. The process 500 may comport with embodiments described in reference to FIGS. 1-4. In alternate embodiments, the process 500 may be practiced with more or fewer operations, or a different order of the operations.

The process 500 may begin at block 502 and include disposing an opto-electronic component of an optical transceiver in a first portion of a die comprising a first integrated circuit, proximate to a surface of the die. The operations of block 502 may include fabricating the die, such as an NIPD die, prior to disposing the opto-electronic component in the die. The fabrication may start with providing a semiconductor (e.g., silicon or silicon-on-insulator) substrate. Next, the bottom contact layer may be formed by implanting P-type or N-type dopants, depending on the photodiode polarity, selectively in certain locations of the die, such as in first and second portions of the die as described above. The semiconductor layer may be deposited and patterned to form the photodetector mesas. Passivation of the patterned mesas may be performed to passivate any mesa surface defect sites. Then the top of the active region mesa may be implanted with dopant with polarity opposite to the substrate implant to form the PIN (or NIP) photodiode.

At block 504, the process 500 may include disposing a first trace proximate to the surface of the die, including extending the at least a trace substantially to the surface in a second portion of the die adjacent to the first portion.

At block 506, the process 500 may include coupling the opto-electronic component with the first trace, to provide electrical connection for the optical transceiver and a second integrated circuit to be coupled with the second portion of the die in a chip-on-chip configuration.

At block 508, the process 500 may include disposing a second trace proximate to the surface in the second portion of the die, including extending the second trace substantially to the surface in the second portion, to provide electrical connection for the second integrated circuit and a substrate to be coupled with the second portion of the die in a chip-on-substrate configuration.

The operations described in reference to blocks 504, 506, and 508 may be provided by the following actions. A dielectric layer (e.g., oxide, nitride, or the like) may be deposited on top of the semiconductor substrate, to planarize the substrate. Metal contact vias may be etched through the insulating dielectric down to the P and N layers, and filled with metallization. Metallization may be patterned to form the photodiode metal traces and pads. Insulating dielectric directly above the photodiode mesa may be etched and an anti-reflection coating may be deposited to maximize the photodiode responsivity.

Figure 6:
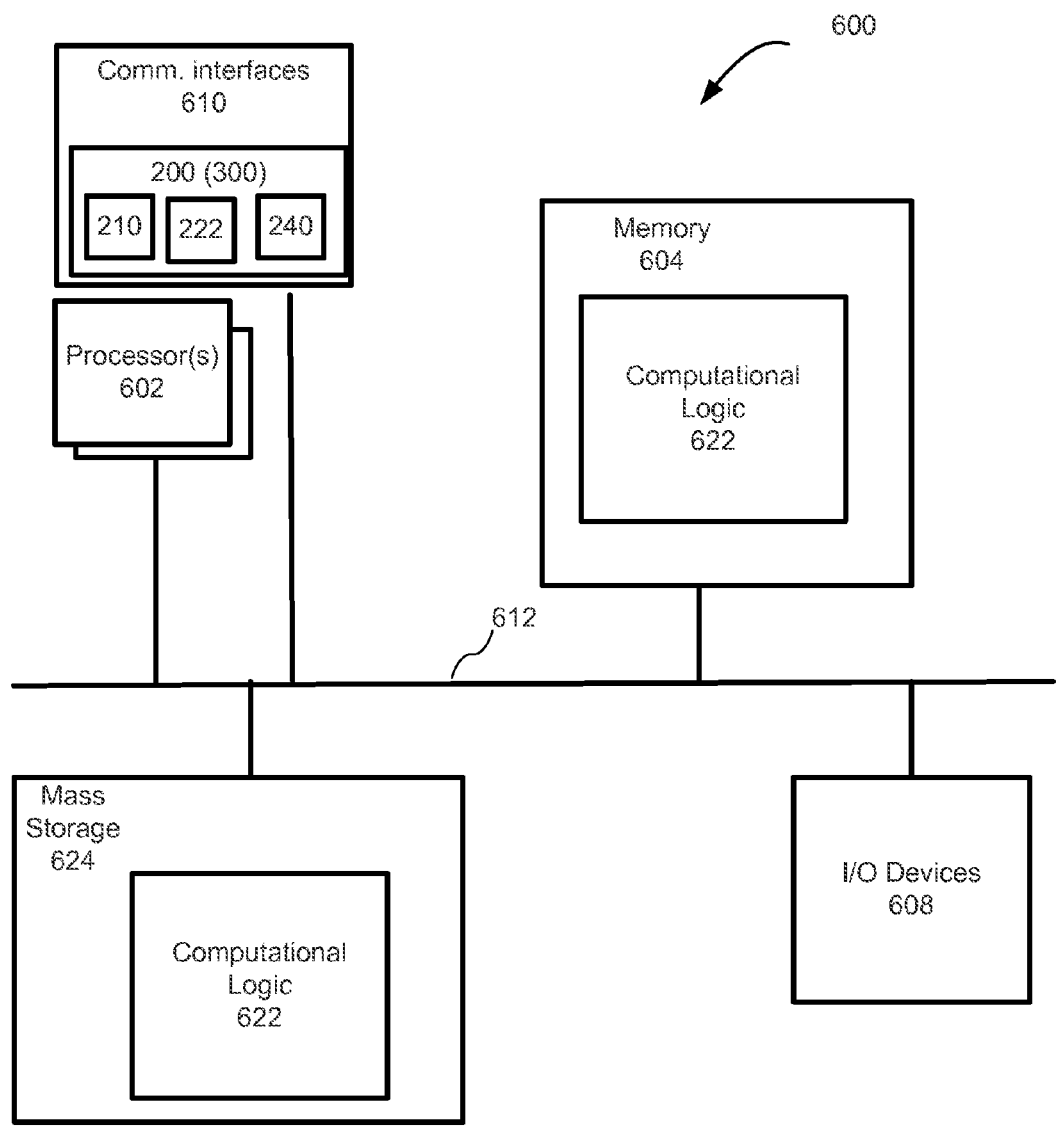
FIG. 6 illustrates an example computing device suitable for use to practice aspects of the present disclosure, in accordance with some embodiments.

FIG. 6 illustrates an example computing device 600 suitable for use with various components of FIGS. 1-4, in accordance with some embodiments. In some embodiments, example computing device 600 may include various components described in reference to FIGS. 1-4.

As shown, computing device 600 may include one or more processors or processor cores 602 and system memory 604. For the purpose of this application, including the claims, the terms "processor" and "processor cores" may be considered synonymous, unless the context clearly requires otherwise. The processor 602 may include any type of processors, such as a central processing unit (CPU), a microprocessor, and the like. The processor 602 may be implemented as an integrated circuit having multi-cores, e.g., a multi-core microprocessor.

The computing device 600 may include mass storage devices 624 (such as solid state drives, volatile memory (e.g., dynamic random-access memory (DRAM), and so forth)). In general, system memory 604 and/or mass storage devices 624 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 600 may further include input/output (I/O) devices 608 (such as display, soft keyboard, touch sensitive screen, image capture device, and so forth) and communication interfaces 610 (such as network interface cards, modems, infrared receivers, radio receivers (e.g., Near Field Communication (NFC), Bluetooth, WiFi, 4G/5G Long Term Evolution (LTE), and so forth).

The communication interfaces 610 may include communication chips (not shown) that may be configured to operate the device 600 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication interfaces may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 610 may operate in accordance with other wireless protocols in other embodiments.

In some embodiments, the communication interfaces 610 may comprise the IC assembly 200 of FIGS. 2 and 4 and/or IC assembly 300 of FIG. 3. More specifically, the communication interfaces 610 may include one or more optical transceivers 212 and IC 222 (e.g., receiver) coupled together in a chip-on-chip configuration, and substrate 240 (e.g., PCB) coupled with the IC 222 in a chip-on-substrate configuration as described in reference to FIGS. 2-4. The IC assembly 200 (300) may be provided, for example, to enable communications between the processors 602 and other components of the computing device 600 or another (e.g., external) apparatus (not shown), via the I/O devices 608.

The above-described computing device 600 elements may be coupled to each other via system bus 612, which may represent one or more buses. In the case of multiple buses, they may be bridged by one or more bus bridges (not shown). Each of these elements may perform its conventional functions known in the art. In particular, system memory 604 and mass storage devices 624 may be employed to store a working copy and a permanent copy of the programming instructions implementing firmware, an operating system and/or one or more applications to be executed on computing device. Some of the firmware may configure, control and/or operate the integrated circuits associated with the IC assembly described in reference to FIGS. 2-4, collectively denoted as computational logic 622. Computational logic 622 may be implemented in assembler instructions supported by processor(s) 602 or high-level languages that may be compiled into such instructions.

The number, capability, and/or capacity of the elements 608, 610, 612 may vary, depending on whether computing device 600 is used as a mobile computing device, such as a tablet computing device, laptop computer, game console, or smartphone, or a stationary computing device, such as a set-top box or desktop computer. Their constitutions are otherwise known, and accordingly will not be further described.

At least one of processors 602 may be packaged together with memory having computational logic 622 to form a System in Package (SiP) or a System on Chip (SoC). In various implementations, the computing device 600 may comprise a mobile computing device, such as a smartphone, a tablet, a personal digital assistant (PDA), an ultra mobile PC, or any other mobile computing device. In various embodiments, the computing device may comprise a laptop, a netbook, a notebook, or an ultrabook. In further implementations, the computing device 600 may be any other electronic device that processes data.

The embodiments described herein may be further illustrated by the following examples. Example 1 is an integrated circuit, comprising: an optical transceiver having an opto-electronic component disposed in a first portion of a die, proximate to a surface of the die; and at least a trace coupled with the opto-electronic component and disposed proximate to the surface of the die to extend substantially to the surface in a second portion of the die adjacent to the first portion, to provide electrical connection for the integrated circuit and another integrated circuit to be coupled with the second portion of the die in a chip-on-chip configuration.

Example 2 may include the subject matter of Example 1, wherein the integrated circuit is a first integrated circuit, wherein the other integrated circuit is a second integrated circuit, wherein at least a trace comprises at least a first trace, and wherein the first integrated circuit further comprises at least a second trace disposed proximate to the surface in the second portion of the die to extend substantially to the surface in the second portion, to provide electrical connection for the second integrated circuit and a substrate to be coupled with the second portion of the die in a chip-on-substrate configuration.

Example 3 may include the subject matter of Example 2, wherein the second integrated circuit is to be disposed on the second portion of the die in the chip-on-chip configuration with the first integrated circuit.

Example 4 may include the subject matter of Example 2, wherein the substrate is to be disposed over the second portion of the die in the chip-on-substrate configuration with the second integrated circuit.

Example 5 may include the subject matter of Example 2, wherein the opto-electronic component comprises a normal-incidence photodetector (NIPD), to receive an optical signal and transmit a corresponding electrical output signal via the at least a first trace, wherein the second integrated circuit comprises a receiver, to amplify the electrical output signal and to provide the amplified electrical output signal to circuitry disposed in the substrate via the at least a second trace.

Example 6 may include the subject matter of Example 5, further comprising an array of lenses optically coupled with the NIPD, wherein the at least a first trace comprises a first plurality of traces, to electrically couple the NIPD with inputs of the receiver.

Example 7 may include the subject matter of Example 6, wherein the at least a second trace comprises a second plurality of traces, to electrically couple outputs of the receiver with the circuitry disposed in the substrate.

Example 8 may include the subject matter of Example 7, wherein the second plurality of traces are disposed in the second portion of the die in a multi-layered fashion.

Example 9 may include the subject matter of Example 7, wherein the first and second plurality of traces include contact pads disposed at respective ends of traces to extend to the surface of the die, to provide electrical connectivity for the first and second integrated circuits and the circuitry disposed in the substrate.

Example 10 may include the subject matter of Example 6, wherein the array of lenses is disposed above the first portion of the die, wherein each of the lenses includes a facet, to prevent formation of resonant cavities between the lenses and the NIPD.

Example 11 may include the subject matter of Example 10, wherein the die includes a distributed Bragg reflector multilayer stack, to provide a determined optical response for the NIPD.

Example 12 may include the subject matter of Example 7, wherein the surface is a first surface, wherein the die includes a semiconductor substrate having a second surface opposite the first surface, wherein the array of lenses is disposed on the second surface in the first portion of the die.

Example 13 may include the subject matter of Example 12, wherein at least one of the second plurality of traces comprises a reflector, to provide a determined optical response for the NIPD.

Example 14 may include of the subject matter of any of Examples 2 to 13, wherein the substrate comprises a printed circuit board (PCB).

Example 15 is an apparatus with a chip-on-chip and chip-on-substrate configuration, comprising: a processor; and an optical transceiver communicatively coupled with the processor, and including an opto-electronic component disposed in a first portion of a die, proximate to a surface of the die; and at least a trace coupled with the opto-electronic component and disposed proximate to the surface of the die to extend substantially to the surface in a second portion of the die adjacent to the first portion, to provide electrical connection for the optical transceiver and an integrated circuit to be coupled with the second portion of the die in a chip-on-chip configuration, to provide communicative connection between the apparatus and another apparatus.

Example 16 may include the subject matter of Example 15, wherein the optical transceiver is a first integrated circuit and wherein the integrated circuit is a second integrated circuit, wherein the at least trace is at least a first trace, wherein the first integrated circuit further comprises at least a second trace disposed proximate to the surface in the second portion of the die to extend substantially to the surface in the second portion, to provide electrical connection for the second integrated circuit and a substrate to be coupled with the second portion of the die in a chip-on-substrate configuration.

Example 17 may include the subject matter of Example 16, wherein the second integrated circuit is to be disposed on the second portion of the die in the chip-on-chip configuration with the first integrated circuit, wherein the substrate is to be disposed over the second portion of the die in the chip-on-substrate configuration with the second integrated circuit.

Example 18 may include the subject matter of Example 17, wherein the substrate comprises a printed circuit board (PCB), wherein the apparatus comprises a mobile computing device.

Example 19 is a method for providing an integrated circuit, comprising: disposing an opto-electronic component of an optical transceiver in a first portion of a die, proximate to a surface of the die; disposing at least a trace proximate to the surface of the die, including extending the at least a trace substantially to the surface in a second portion of the die adjacent to the first portion; and coupling the opto-electronic component with the at least a trace, to provide electrical connection for the optical transceiver and an integrated circuit to be coupled with the second portion of the die in a chip-on-chip configuration.

Example 20 may include the subject matter of Example 19, wherein the optical transceiver comprises a first integrated circuit disposed in the die and wherein the integrated circuit is a second integrated circuit, wherein the at least trace is at least a first trace, wherein the method further comprises: disposing at least a second trace proximate to the surface in the second portion of the die, including extending the at least a second trace substantially to the surface in the second portion, to provide electrical connection for the second integrated circuit and a substrate to be coupled with the second portion of the die in a chip-on-substrate configuration.

Example 21 may include the subject matter of Example 20, wherein the opto-electronic component comprises a normal-incidence photodetector (NIPD), wherein the second integrated circuit comprises a receiver, wherein the method further comprises: disposing an array of lenses on the die, to provide optical coupling for a light source coupled with the first integrated circuit, with the NIPD.

Example 22 may include the subject matter of Example 21, wherein disposing an array of lenses on the die includes providing the array of lenses above the first portion of the die.

Example 23 may include the subject matter of Example 21, wherein the surface is a first surface, wherein the die includes a dielectric substrate having a second surface opposite the first surface, wherein the disposing an array of lenses on the die includes providing the array of lenses on the second surface in the first portion of the die.

Example 24 may include the subject matter of Example 20, further comprising: disposing the second integrated circuit on the second portion of the die in the chip-on-chip configuration.

Example 25 may include the subject matter of any of Examples 20 to 24, further comprising: disposing the substrate over the second portion of the die in the chip-on-substrate configuration.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An integrated circuit assembly, comprising:
a first integrated circuit disposed in a first portion of a die proximate to a first surface of the die, wherein the die includes the first portion and a second portion adjacent to the first portion, wherein the first surface of the die extends to the first and second portions of the die, wherein the first integrated circuit comprises an optical transceiver with an opto-electronic component comprising a normal-incidence photodetector (NIPD);
at least a trace coupled with the opto-electronic component and disposed proximate to the first surface of the die to extend substantially to the first surface in the second portion of the die;
a second integrated circuit comprising a receiver, that is disposed in the second portion of the die outside of the first portion of the die, in a chip-on-chip configuration with the first integrated circuit, wherein the trace is to provide electrical connection between the optical transceiver of the first integrated circuit and the second integrated circuit; and
an array of lenses optically coupled with the optical transceiver and disposed on a second surface of the die, opposite the first surface, in the first portion of the die.

2. The integrated circuit assembly of claim 1, wherein a substrate is to be disposed over at least a third portion of the die in a chip-on-substrate configuration with the second integrated circuit.

3. The integrated circuit assembly of claim 2, wherein the NIPD is to receive an optical signal and transmit a corresponding electrical output signal via the trace, wherein the second integrated circuit comprises a receiver, to amplify the electrical output signal and to provide the amplified electrical output signal to circuitry disposed in the substrate via at least a second trace.

4. The integrated circuit of claim 3, wherein the trace is a first trace, wherein the first trace comprises a first plurality of traces, to electrically couple the NIPD with inputs of the receiver.

5. The integrated circuit assembly of claim 4, further comprising at least a second trace that includes a second plurality of traces, to electrically couple outputs of the receiver with the circuitry disposed in the substrate.

6. The integrated circuit assembly of claim 5, wherein at least one of the second plurality of traces comprises a reflector, to provide a determined optical response for the NIPD.

7. The integrated circuit assembly of claim 5, wherein the second plurality of traces are disposed in the second portion of the die in a multi-layered fashion.

8. The integrated circuit assembly of claim 5, wherein the first and second plurality of traces include contact pads disposed at respective ends of traces to extend to the first surface of the die, to provide electrical connectivity for the first and second integrated circuits and the circuitry disposed in the substrate.

9. The integrated circuit assembly of claim 4, wherein each of the lenses includes a facet, to prevent formation of resonant cavities between the lenses and the NIPD.

10. The integrated circuit assembly of claim 9, wherein the die includes a distributed Bragg reflector multilayer stack, to provide a determined optical response for the NIPD.

11. The integrated circuit assembly of claim 1, wherein the assembly comprises a printed circuit board (PCB).

12. An apparatus comprising:
a processor;
a first integrated circuit comprising an optical transceiver communicatively coupled with the processor, and including an opto-electronic component-disposed in a first portion of a die, proximate to a first surface of the die, wherein the opto-electronic component comprises a normal-incidence photodetector (NIPD);
a second integrated circuit comprising a receiver, that is disposed in a second portion of the die outside of the first portion of the die, in a chip-on-chip configuration with the first integrated circuit;
at least a trace coupled with the opto-electronic component and disposed proximate to the first surface of the die to extend substantially to the first surface in the second portion of the die adjacent to the first portion, to provide electrical connection for the optical transceiver and the second integrated circuit; and
an array of lenses optically coupled with the optical transceiver and disposed on a second surface of the die, opposite the first surface, in the first portion of the die.

13. The apparatus of claim 12, further comprising a substrate disposed over at least the second portion of the die in a chip-on-substrate configuration with the second integrated circuit.

14. The apparatus of claim 13, wherein the substrate comprises a printed circuit board (PCB), wherein the apparatus comprises a mobile computing device.

15. A method, comprising:
providing a first integrated circuit, including disposing an opto-electronic component of an optical transceiver in a first portion of a die, proximate to a first surface of the die, wherein the die includes a first portion and a second portion adjacent to the first portion, wherein the first surface of the die extends to the first and second portions of the die, the opto-electronic component comprising a normal-incidence photodetector (NIPD);
disposing at least a trace proximate to the first surface of the die, including extending the at least a trace substantially to the first surface in the second portion of the die adjacent to the first portion;
providing a second integrated circuit comprising a receiver, including disposing the receiver in the second portion of the die outside of the first portion of the die, on the first surface;
coupling the opto-electronic component with the at least a trace, to provide electrical connection for the optical transceiver and the second integrated circuit in a chip-on-chip configuration; and
disposing an array of lenses on a second surface of the die, opposite the first surface, in the first portion of the die, to be optically coupled with the optical transceiver.

16. The method of claim 15, wherein disposing the array of lenses on the die includes providing the array of lenses above the first portion of the die.

17. The method of claim 15, further comprising:
  disposing a substrate over at least the second portion of the die in a chip-on-substrate configuration.

\* \* \* \* \*